United States Patent [19]

Weiss

[11] 4,015,210
[45] Mar. 29, 1977

[54] CIRCUIT FOR DETECTING PREDETERMINED VOLTAGE LEVEL CROSSINGS OF THE MODULATING COMPONENT OF A FREQUENCY MODULATED SIGNAL

[76] Inventor: Stephen F. Weiss, 2157 N. 64th, Seattle, Wash. 98103

[22] Filed: Apr. 15, 1976

[21] Appl. No.: 677,365

[52] U.S. Cl. .................... 329/50; 328/110; 328/138; 329/107; 329/122; 329/128
[51] Int. Cl.$^2$ .............. H03D 3/18; H03K 9/06
[58] Field of Search ............ 329/50, 107, 122, 126, 329/128; 328/108–110, 129, 130, 138; 307/233 R, 234

[56] References Cited

UNITED STATES PATENTS

| 3,187,261 | 6/1965 | Matsushima | 328/110 |
| 3,493,877 | 2/1970 | Jacobson | 329/126 X |
| 3,634,869 | 1/1972 | Hsueh | 307/234 |

Primary Examiner—Siegfried H. Grimm

[57] ABSTRACT

In the illustrative embodiment, a one shot multivibrator is adapted to receive an incoming FM signal at its input, and in operation generates a series of pulses which coincide in time with the positive peaks of the received FM signal. The series of pulses generated by the multivibrator is in turn applied to an initiate/reset input of a free-running pulse generator which is arranged so that, when it is permitted to free-run, it emits a train of pulses having a preset pulse interval identical to the interval between successive positive peaks of the incoming FM signal at the particular point in time when the instantaneous voltage level of the modulating signal component of the FM signal is equal to the predetermined voltage level. The application of the pulses from the multivibrator to the initiate/reset input of the pulse generator synchronizes the pulse generator to the multivibrator, so that an output from the pulse generator is an indication that the predetermined voltage level has been crossed by the modulating signal component of the FM signal. The illustrative embodiment also may include a coincidence circuit which in operation compares the timing of the pulses from the multivibrator with the timing of the pulses from the pulse generator and generates an output signal when coincidence occurs, each output from the coincidence circuit serving to indicate a predetermined voltage level crossing.

5 Claims, 5 Drawing Figures

CIRCUIT FOR DETECTING PREDETERMINED VOLTAGE LEVEL CROSSINGS OF THE MODULATING COMPONENT OF A FREQUENCY MODULATED SIGNAL

BACKGROUND OF INVENTION

The present invention relates generally to the art of voltage level detectors, and more specifically is concerned with the detection of voltage level crossings of the modulating signal component of a frequency modulated signal.

In a frequency modulated signal, such as an FM broadcast signal, the information is represented in the frequency domain. The original information waveform, e.g. an audio signal waveform, is referred to as the modulating signal and in that form the information is represented by the varying voltage characteristics of the waveform. When the original information waveform is used to frequency-modulate a carrier signal, however, the information is translated so that it is represented by the variance in frequency of the carrier signal about the carrier center frequency. Thus, for instance, a modulating signal which varies between +50 volts and −50 volts in accordance with the information it represents will, when used to frequency-modulate a carrier signal having a frequency of 300 MHz, produce an FM signal which swings correspondingly between a frequency of 350 and 250 megacycles about the carrier center frequency of 300 MHz.

It is desirable in some applications using FM signals to know when the modulating component of the FM signal either crosses a zero voltage level or some other predetermined voltage level. This cannot be done by directly measuring the voltage level of the FM signal, and so the FM signal must first be converted into a form where it is possible. Typically, the FM signal is first demodulated and the resulting signal applied to a discriminator, which produces a voltage-varying signal, which signal in turn is applied to a level detector. This process is expensive and complex, slow and often imprecise.

In view of the above, it is a general object of the present invention to provide a voltage level detection circuit which overcomes the disadvantages of the prior art stated above.

It is another object of the present invention to provide such a circuit which provides an indication of voltage level crossings by the modulating component of a frequency modulated signal without the demodulation thereof.

It is a further object of the present invention to provide such a circuit wherein the value of the voltage level may be varied.

SUMMARY OF THE INVENTION

Accordingly, the present invention is a circuit for detecting the crossing of a predetermined voltage level by a modulating signal component of a frequency modulated signal. The circuit includes means adapted to receive the frequency modulated signal for generating a series of pulses, each of the pulses in said series being coincident in time with the same relative point on the waveform of the frequency modulated signal for successive cycles thereof, the pulse interval between successive pulses in said series of pulses hence being a varying interval of time corresponding to the manner in which the frequency modulated signal varies in frequency. Also included is a timing means which generates a train of pulses having a preset pulse interval, the preset pulse interval being equal in time to the particular interval of time between successive pulses (referred to as the instantaneous interval) when the modulating signal component of the frequency modulating signal has a voltage level equal to said predetermined voltage level. An initiating and resetting means is provided to initiate and reset the timing means upon each occurrence of a pulse from the pulse generating means. An output signal produced by the timing means is indicative of the condition that the instantaneous interval of time equal to the preset pulse interval, and hence is reliable and timely indication that the modulating signal component has crossed said predetermined voltage level.

DESCRIPTION OF DRAWINGS

A more thorough understanding of the invention may be obtained by a study of the following detailed description taken in connection with the accompanying drawings in which.

DESCRIPTION OF PREFERRED EMBODIMENT

The present invention concerns the determination of the point in time of when the modulating signal component of a frequency modulated signal crosses a predetermined voltage level. The basic function of the invention is easily grasped when the function is explained in terms of an FM signal which has for instance, a carrier signal of 300 MHz and a modulating signal of a substantially lower frequency, typically in the audio range, which contains the information to be transmitted. It should be understood, the principles of the present invention apply to any frequency modulated signal having a frequency varying characteristic which is a function of the voltage varying characteristic of its modulating signal component and not limited just to FM broadcast signals.

Figure 2A:
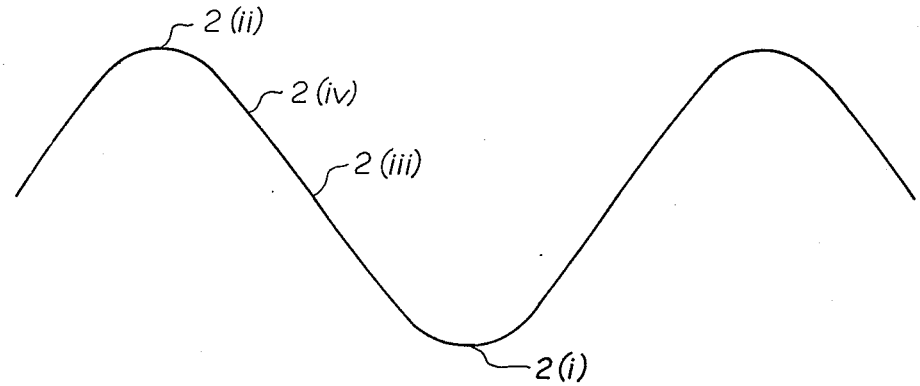
FIGS. 2a, 2b, and 2c are a series of waveforms, the upper waveform (FIG. 2a) being a sine wave modulating signal, the intermediate waveform (FIG. 2b) being a frequency-modulated signal with the modulating signal component thereof being the waveform of FIG. 2a, and the lower waveform (FIG. 2c) being the signal output from the multivibrator of FIG. 1a when the waveform of FIG. 2b is applied as an input signal thereto.

A simple example of a modulating signal is the sine wave shown in FIG. 2a. of course, it should be understood that many other configurations of modulating signals, such as pulses, square waves, irregular, or interrupted signals can be used in practicing the present invention, and the sine wave of FIG. 2a is by way of example only.

When a modulating signal modulates a carrier signal, the resulting signal will vary in frequency about its middle frequency (i.e. 300MHz) in accordance with the change in voltage level of the modulating signal. Typically, the resulting FM signal will maintain a constant amplitude such as the signal shown in FIG. 2b, but this is not necessarily so.

In a frequency modulated signal, the voltage characteristic of the modulating signal is represented by a change in the frequency of the carrier signal. Hence, the voltage of the modulating signal cannot be determined by inspection or interrogation of the amplitude of the resulting FM signal. The circuit of the present invention, shown in block diagram form in FIGS. 1a and 1b, has been designed specifically for the purpose of detecting crossings of predetermined voltage levels by the modulating component of the frequency modulated signal. This is accomplished without demodulating the FM signal.

Figure 1A:
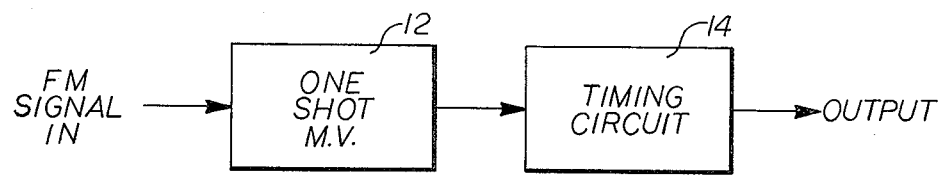
FIG. 1a is a generalized block diagram of the circuit of the present invention.
Figure 2B:
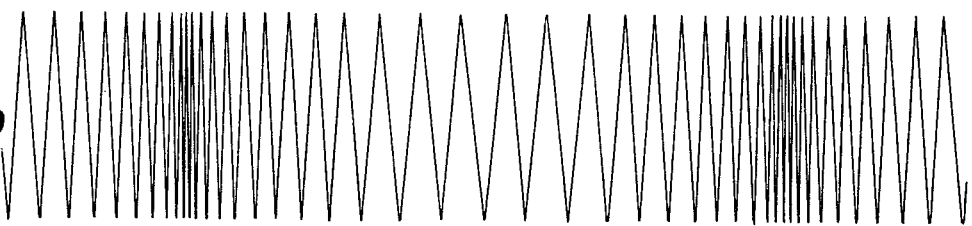

Referring to FIG. 1a, an incoming FM signal, such as that shown in FIG. 2b, is applied as an input to a one-shot multivibrator 12. The circuit components of the multivibrator 12 are selected so that the multivibrator will trigger and generate a single, spike-like pulse at the successive positive peaks of the FM signal. Any other circuit which could be adapted or utilized to perform a similar function may be substituted for multivibrator 12 within the spirit of the present invention. For instance, a slope detector could be utilized to detect the positive peaks of the FM signal, and to subsequently generate a pulse upon detection thereof. Schmidt trigger circuits also could be adapted for such a purpose.

Figure 2C:

The output of multivibrator 12 is a series of pulses which are coincident in time with the occurrence of the positive peaks of the incoming FM signal. The pulses thus have a pulse interval which corresponds to the interval between successive positive peaks of the FM signal. Such a series of pulses for the FM signal of FIG. 2b is shown in FIG. 2c. It should be understood that the series of pulses generated by multivibrator 12 corresponds in frequency to the varying frequency characteristic of the incoming FM signal, with the pulse interval of the series of pulses from multivibrator 12 changing with the change in frequency of the incoming FM signal. The series of pulses from multivibrator 12 is then applied as an input to a circuit shown in FIG. 1a as a generalized timing circuit 14.

The complexity of timing circuit 14 depends upon the value of the predetermined voltage crossing level. Referring to the waveform of FIG. 2a, a simplified timing circuit, which will be explained in detail in following paragraphs, may be used when the predetermined voltage crossing level coincides with the lowest point on the wave form, i.e. point 2(i) in FIG. 2a. For other predetermined voltage levels, however, such as those coincident with points 2(ii), 2(iii) or 2(iv) in FIG. 2a, a more complicated timing circuit is necessary.

When the timing circuit 14 can be simple, i.e., when the predetermined voltage crossing level coincides with the lowest voltage point on the modulating signal waveform, timing circuit 14 consists simply of a free running pulse generator or oscillator having a conventional initiate/reset input connection, to which is applied the series of pulses from multivibrator 12. The value of the circuit components of the pulse generator are selected so that the output from the pulse generator has a pulse interval which is equal to the interval between successive positive peaks of the FM signal input to multivibrator 12 when the modulation signal component is at its lowest voltage level.

The desired pulse interval is first calculated, and then the pulse generator is adjusted or preset to produce pulses having the desired interval. The calculation of the desired pulse interval is simple and straightforward. If, for instance, the lowest frequency in the incoming FM signal is 250MHz, which corresponds to the lowest voltage on the modulating signal waveform, the desired interval is $1(250 \times 106) = 4$ nano seconds. Once the desired pulse interval is calculated, the circuit component values for the pulse generator in timing circuit 14 can be calculated and the generator then constructed.

In operation, each pulse in the series of pulses from the multivibrator 12 initiates and resets operation of timing circuit 14. Therefore, timing circuit 14 is synchronized with multivibrator 12. When the circuit components of the pulse generator are established so that its preset pulse interval coincides with the pulse interval of the signal from multivibrator 12 when the modulating component of the FM signal is at its lowest level, the pulse generator will be reset by successive pulses from multivibrator 12 before the pulse generator is able to produce a pulse until the point in time is reached when the modulating signal of the FM signal input to multivibrator 12 actually reaches its lowest voltage level. At this point in time, the pulse interval for the series of pulses from multivibrator 12 is equal to or slightly larger than the preset pulse interval of the pulse generator pulses, so that a pulse is finally produced by the timing circuit 14 before being reset by the next successive pulse from multivibrator 12. This pulse output from the timing circuit 14 is an indication that the lowest voltage point of the modulating signal component has been reached and crossed, and hence serves as the circuit output signal.

Figure 1B:
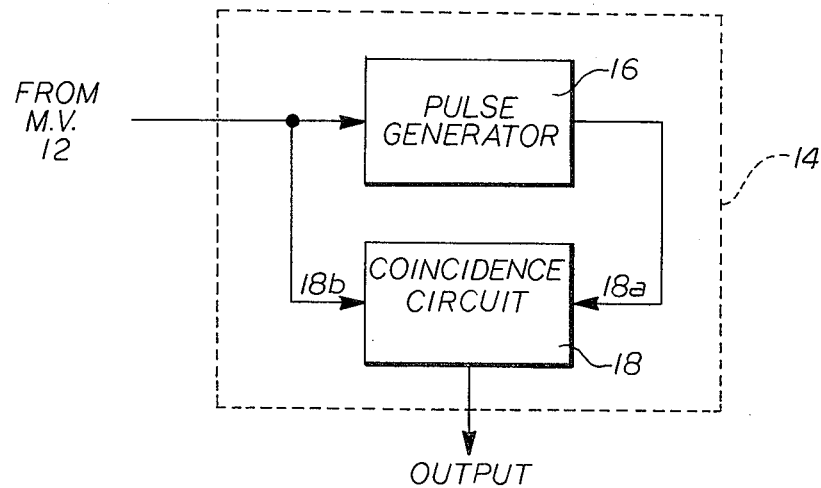
FIG. 1b is a block diagram showing one portion of the block diagram of FIG. 1a in more detail.

If it is desired to detect voltage crossings of predetermined voltage levels other than the lowest voltage point [point 2(i)] of the modulating signal component, a more complicated timing circuit, as shown in FIG. 1b, is necessary in order to provide an accurate indication of level crossing. The remaining portions of the circuit, however, remain the same, and operate in the same manner. Thus, for the circuit of FIG. 1b, when the predetermined voltage level is for instance at point 2(iii) of the modulating signal component waveform of FIG. 2a, the FM signal (FIG. 2b) is still applied to a one-shot multivibrator 12 or equivalent circuit, which in turn produces an output comprising a series of pulses coincident in time with the positive peaks of the incoming FM signal as shown in FIG. 2c.

Referring now specifically to FIG. 1b, the series of pulses from multivibrator 12 is supplied directly to the initiate/reset input of free-running pulse generator 16 which generates a train of pulses having a preset pulse interval which is preset coincident with the corresponding interval between successive positive peaks of the incoming FM signal at the point in time when the modulating signal component thereof crosses the predetermined voltage level. Thus, with respect to the detection of a crossing of the voltage level of point 2(iii) on the waveform of FIG. 2a, referred to as a zero crossing because the point is midway between the positive and negative peaks of the waveform, the desired interval between successive pulses of pulse generation 16 is actually the period of the FM carrier frequency, since the incoming FM signal will be at its carrier frequency when it's modulating signal component is at the point labeled 2(iii).

The output pulses from pulse generator 16 are applied to one input 18a of a coincidence circuit 18, which typically takes the form of a conventional AND gate. Applied to the other input 18b of coincidence circuit 18 is the series of pulses from multivibrator 12, which pulses are hence simultaneously applied to the input of pulse generator 16 and input 18b of coincidence circuit 18. The output from coincidence circuit 18 is the output of the level crossing detector circuit and is the indication that a crossing of the predetermined level has occurred.

In operation, as the instantaneous frequency of the incoming FM signal applied to pulse generator 16 decreases, for example, from its highest frequency, and hence, as the period of the FM signal increases correspondingly, there will be no output from pulse generator 16 because successive pulses from multivibrator 12 reset pulse generator 16 before it can emit a pulse. This is due to the fact that at that instantaneous frequency of the FM signal, the pulse interval for the pulses from multivibrator 12 is less then the preestablished preset pulse interval of the series of pulses from pulse generator 16. As the instantaneous frequency of the FM signal decreases, and hence, as the pulse interval of the pulses from multivibrator 12 increases correspondingly toward the value of the preset pulse interval of pulse generator 16, which preset interval corresponds to the predetermined voltage level, the output of pulse generator 16 will remain inhibited. As the length of the pulse interval of the pulses from the multivibrator 12 increases still further, the point in time will eventually be reached when the leading edge of the pulse output from pulse generator 16 occurs before the next successive pulse from multivibrator 12 can reset the pulse generator 16.

At this point in time, pulse generator 16 emits a pulse. The occurrence of a pulse from multivibrator 12 will, however, immediately reset the pulse generator 16. Pulse generator 16 will produce pulses periodically, that is, after each reset, as long as the pulse interval of the pulses from multivibrator 12 remains longer than the preset interval of the pulses from pulse generator 16. The length of time over which pulses are produced by pulse generator 16 depends on the value of the predetermined voltage, i.e. the position of the selected point on the modulating signal component waveform.

The pulses from pulse generator 16 are applied to input 18a of coincidence circuit 18, while the series of pulses from multivibrator 12 are applied to input 18b thereof. Coincidence circuit 18 is used to determine coincidence in time of pulses at its respective inputs, and hence, the point in time when the varying pulse interval of the pulses from multivibrator 12 at input 18b is equal to or longer than the preset pulse interval of the pulses from pulse generator 16 at input 18a. The determination of coincidence will then in turn be indicative of an actual crossing at the predetermined voltage level by the modulating signal component of the incoming FM signal under interrogation. Coincidence occurs when a pulse from multivibrator 12 is present at input 18b during any portion of the period that a pulse from pulse generator 16 is present at input 18a. Since the pulses from pulse generator 16 are relatively narrow, as are those from multivibrator 12 (FIG. 2c), such a coincidence is a positive indication that the variable pulse interval of the series of pulses from multivibrator 12 is substantially identical to the preset pulse interval of the pulses from the pulse generator 16, and hence, that the modulating signal component has at that point in time an instantaneous voltage level equal to the predetermined voltage level.

Thus, when a pulse from multivibrator 12 is present at input 18b of coincidence circuit 18 at any time during the presence of a pulse from pulse generator 16 at input 18a, coincidence circuit 18 produces an output pulse, which is the output signal from the level crossing detector circuit of the present invention indicating that the modulating signal component has crossed the predetermined voltage level.

Hence, a reliable indication of a predetermined voltage level crossing by a modulating signal component of a frequency modulated signal is produced without the necessity of demodulating the original frequency modulated signal. Furthermore, the level of voltage of the predetermined voltage may be changed by altering the component values of the circuit correspondingly. It should be understood that the particular circuits discussed in detail above may be modified or equivalent circuits used within the spirit of the invention. For instance, various circuits can be substituted for the multivibrator to provide a pulse representation of the incoming FM signal. Additionally, a wide variety of embodiments of free running pulse generators or oscillators can be utilized to perform the functions of the timing circuit. Other changes, modifications and substitutions may also be incorporated in the preferred embodiment of the invention discussed in detail above without departing from the spirit of the invention as defined by the claims which follow.

What I claim is:

1. A circuit for detecting the crossing of a predetermined voltage level by a modulating signal component of a frequency modulated signal, comprising:
    a. means adapted to receive at an input connection thereof the frequency modulated signal for generating a series of pulses coincident in time with the same point on successive cycles of the waveform of the frequency modulated signal, the interval between successive pulses in said series of pulses being a varying interval of time in accordance with a variation in frequency of the frequency modulated signal;
    b. timing means for generating a train of pulses having a preset interval of time between successive pulses thereof, said preset interval of time being equal to said varying interval of time when the modulating signal component has an instantaneous voltage level which is equal to said predetermined voltage level;
    c. means resetting and initiating said timing means upon the occurrence of each pulse in said series of pulses, said timing means thereby providing an output signal when said varying interval of time is substantially equal to said preset interval of time, the occurrence of said output signal being indicative that the instantaneous voltage level of the modulating signal component has crossed said predetermined voltage level.

2. A circuit of claim 1, including coincidence circuit means having two inputs and an output, said coincidence circuit means including means applying said series of pulses to one input thereof and said train of pulses to the other input thereof, a coincidence in time between the presence of one of said series of pulses at said one input and one of said train of pulses at said other input resulting in an output pulse at said output of said coincidence circuit, said output pulse being indicative of the crossing of said predetermined voltage level by the modulating signal component.

3. An apparatus of claim 2, wherein said coincidence circuit is an AND gate.

4. An apparatus of claim 2, wherein said point on successive cycles of the waveform of the frequency modulated signal is the positive peaks thereof.

5. An apparatus of claim 4, wherein said resetting and initiating means is an initiate and reset input connection on said timing means.

* * * * *